(12) United States Patent
Yamashita (10) Patent No.: US 9,197,190 B2
(45) Date of Patent: Nov. 24, 2015

(54) ELECTRONIC COMPONENT MODULE

(71) Applicant: TAIYO YUDEN CO., LTD., Tokyo (JP)

(72) Inventor: Takashi Yamashita, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 129 days.

(21) Appl. No.: 14/063,144

(22) Filed: Oct. 25, 2013

(65) Prior Publication Data

US 2014/0118093 A1  May 1, 2014

(30) Foreign Application Priority Data

Oct. 30, 2012 (JP) ................................. 2012-239554

(51) Int. Cl.
| | |
|---|---|
| H03H 9/00 | (2006.01) |
| H03H 9/25 | (2006.01) |
| H03H 9/05 | (2006.01) |
| H03H 9/10 | (2006.01) |
| H03H 9/54 | (2006.01) |
| H03H 9/17 | (2006.01) |
| H03H 9/64 | (2006.01) |

(52) U.S. Cl.
CPC .............. *H03H 9/25* (2013.01); *H03H 9/0547* (2013.01); *H03H 9/1092* (2013.01); *H03H 9/173* (2013.01); *H03H 9/54* (2013.01); *H03H 9/64* (2013.01); *H03H 9/6483* (2013.01)

(58) Field of Classification Search
None
See application file for complete search history.

(56) References Cited

U.S. PATENT DOCUMENTS

| | | | |
|---|---|---|---|
| 5,281,883 A | 1/1994 | Ikata et al. | |
| 5,977,628 A | 11/1999 | Moriga | |
| 6,927,649 B2 * | 8/2005 | Metzger et al. | 333/133 |
| 7,352,105 B2 * | 4/2008 | Mori et al. | 310/313 R |
| 7,913,367 B2 * | 3/2011 | Tsuda | 29/25.35 |
| 7,999,632 B2 * | 8/2011 | Iwamoto | 333/133 |

(Continued)

FOREIGN PATENT DOCUMENTS

| | | |
|---|---|---|
| JP | 55-093238 A | 7/1980 |
| JP | 04-170811 A | 6/1992 |

(Continued)

OTHER PUBLICATIONS

Japanese Office Action dated Jun. 25, 2013, in a counterpart Japanese patent application No. 2012-145819.

(Continued)

*Primary Examiner* — Tuan T Lam
(74) *Attorney, Agent, or Firm* — Chen Yoshimura LLP (57) ABSTRACT

An electronic component module includes: a multi-layered wiring board formed by stacking insulating layers, an inner wiring layer formed between the insulating layers, and a surface wiring layer formed on an outermost insulating layer of the insulating layers; and an acoustic wave device located inside the multi-layered wiring board, wherein the acoustic wave device includes a functional element and a sealing portion, the functional element being located on a substrate and exciting an acoustic wave, and the sealing portion sealing the functional element so as to form an air-space above the functional element, and a terminal portion of the surface wiring layer does not overlap the air-space of the acoustic wave device as viewed from a stacking direction of the multi-layered wiring board, the terminal portion being a region to which a terminal of an electronic component is fixed in the surface wiring layer.

9 Claims, 12 Drawing Sheets

(56) References Cited

U.S. PATENT DOCUMENTS

| | | | |
|---|---|---|---|
| 2007/0252481 A1* | 11/2007 | Iwamoto et al. | 310/344 |
| 2012/0086309 A1* | 4/2012 | Yamaji et al. | 310/313 B |
| 2013/0099628 A1 | 4/2013 | Inoue et al. | |
| 2013/0257221 A1* | 10/2013 | Yamaji et al. | 310/313 B |
| 2013/0321102 A1* | 12/2013 | Iwaki | 333/193 |
| 2014/0003196 A1 | 1/2014 | Tajima | |
| 2014/0354114 A1* | 12/2014 | Moriya et al. | 310/334 |
| 2014/0368084 A1* | 12/2014 | Fukano et al. | 310/313 B |

FOREIGN PATENT DOCUMENTS

| | | |
|---|---|---|
| JP | 06-188326 A | 7/1994 |
| JP | 07-045735 A | 2/1995 |
| JP | 11-055062 A | 2/1999 |
| JP | 2002-208650 A | 7/2002 |
| JP | 2006-351590 A | 12/2006 |
| JP | 2007-258776 A | 10/2007 |
| JP | 2007-312107 A | 11/2007 |
| JP | 2007-312108 A | 11/2007 |
| JP | 2009-225118 A | 10/2009 |
| JP | 2012-070098 A | 4/2012 |
| JP | 5358724 * | 6/2012 |

OTHER PUBLICATIONS

U.S. Appl. No. 13/903,760, filed May 28, 2013.

Chinese Office Action dated Sep. 6, 2015, in a counterpart Chinese patent application No. 201310258524.6. (Cited in the related U.S. Appl. No. 13/903,760.).

* cited by examiner

ELECTRONIC COMPONENT MODULE

CROSS-REFERENCE TO RELATED APPLICATION

This application is based upon and claims the benefit of priority of the prior Japanese Patent Application No. 2012-239554, filed on Oct. 30, 2012, the entire contents of which are incorporated herein by reference.

FIELD

A certain aspect of the present invention relates to an electronic component module including an acoustic wave device embedded in a multi-layered wiring board.

BACKGROUND

Acoustic wave devices using an acoustic wave are used for filters and duplexers of wireless communication devices such as mobile phone terminals. The acoustic wave devices include surface acoustic wave devices using a SAW (Surface Acoustic Wave) and bulk acoustic wave devices using a bulk acoustic wave. The surface acoustic wave devices include a SAW device having a comb-shaped IDT (Interdigital Transducer) electrode formed on a piezoelectric substrate, a Love wave device having an IDT electrode covered with a dielectric film, and a boundary acoustic wave device having an IDT electrode sealed. The bulk acoustic wave devices include a piezoelectric thin film resonator device having electrodes sandwiching upper and lower surfaces of a piezoelectric film, and a Lamb wave device using a Lamb wave.

The acoustic wave device includes a sealing portion that seals a functional element of the acoustic wave device so that an air-space is formed above the functional element including an electrode exciting an acoustic wave (an IDT electrode formed on the piezoelectric substrate or a pair of electrodes formed on the upper and lower surfaces of the piezoelectric film). This structure enables to secure a region to excite the acoustic wave and maintain characteristics of the acoustic wave device.

As communication devices are downsized, electronic component modules on which the acoustic wave device is mounted are required to be further downsized. To downsize the electronic component module, there has been known a technique that disposes an acoustic wave device inside a multi-layered wiring board formed by stacking a wiring layer such as a metal and an insulating layer such as a resin (e.g. Japanese Patent Application Publication No. 2007-312107).

In the electronic component module having the acoustic wave device embedded in the multi-layered wiring board, when a shock is applied to an electronic component mounted on the surface, the shock may be transmitted to the sealing portion of the internal acoustic wave device located inside crushing the air-space, and the seal may be thereby broken.

SUMMARY OF THE INVENTION

According to an aspect of the present invention, there is provided an electronic component module including: a multi-layered wiring board formed by stacking insulating layers, an inner wiring layer formed between the insulating layers, and a surface wiring layer formed on an outermost insulating layer of the insulating layers; and an acoustic wave device located inside the multi-layered wiring board, wherein the acoustic wave device includes a functional element and a sealing portion, the functional element being located on a substrate and exciting an acoustic wave, and the sealing portion sealing the functional element so as to form an air-space above the functional element, and a terminal portion of the surface wiring layer does not overlap the air-space of the acoustic wave device as viewed from a stacking direction of the multi-layered wiring board, the terminal portion being a region to which a terminal of an electronic component is fixed in the surface wiring layer.

DETAILED DESCRIPTION

Figure 1:
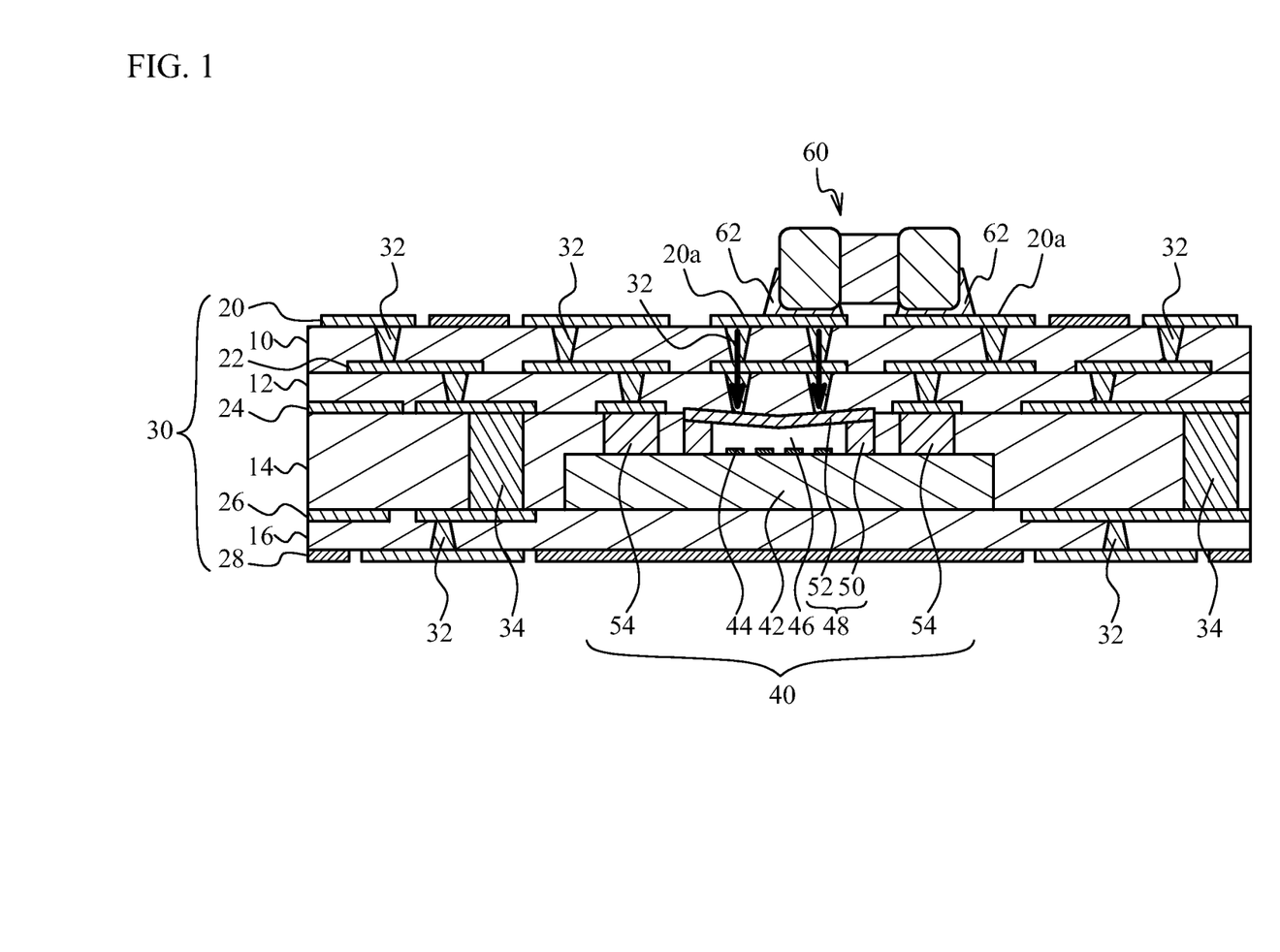
FIG. 1 is a diagram illustrating an electronic component module in accordance with a first comparative example.

FIG. 1 is a schematic cross-sectional view illustrating an electronic component module in accordance with a first comparative example. As illustrated in FIG. 1, the electronic component module of the comparative example includes a multi-layered wiring board 30, an acoustic wave device 40 located (embedded) in the multi-layered wiring board, and an electronic component 60 mounted on the multi-layered wiring board 30.

The multi-layered wiring board 30 is formed by alternately stacking insulating layers 10, 12, 14, 16 and wiring layers 20, 22, 24, 26, 28. The wiring layers include surface wiring layers (20, 28) formed on the surfaces of the multi-layered wiring board 30 and inner wiring layers (22, 24, 26) formed between the insulating layers. The wiring layers are electrically interconnected by vias (32, 34) that are wirings piercing through the insulating layers.

The acoustic wave device 40 includes a functional element 44 that excites an acoustic wave and a sealing portion 48 that seals the functional element 44 so as to form an air-space 46 above the functional element 44, where the functional element 44 includes an IDT or the like formed on a substrate 42. The sealing portion 48 includes a side wall portion 50 surrounding the functional element 44 and a lid portion 52 formed on the side wall portion 50. The lid portion 52 is formed of a metal layer, and is electrically connected to the surface of the multi-layered wiring board 30 through vias 32 formed thereon. The first comparative example uses a surface acoustic wave resonator for an acoustic wave device, but may use other acoustic wave devices (e.g. a bulk acoustic wave device).

The electronic component 60 includes a chip component such as a resistor element, an inductor, or a capacitor and an active element such as a power amplifier, an antenna switch, or a high-frequency IC (Integrated Circuit), and is mounted on the surface wiring layer 20 of the multi-layered wiring board 30. The surface wiring layer 20 formed on the upper surface of the multi-layered wiring board 30 acts as a terminal for mounting the aforementioned electronic component 60 (the following description describes a region of the surface wiring layer 20 in which the electronic component is fixed as a terminal portion 20a). The electronic component 60 is fixed to the terminal portions 20a by, for example, solder 62. The surface wiring layer 28 formed on the lower surface of the multi-layered wiring board 30 acts as an external connection terminal in the electronic component module. That is to say, the electronic component module of the first comparative example is electrically connected to a terminal or the like on the motherboard of an electronic device through the surface wiring layer 28 on the lower surface of the multi-layered wiring board 30.

In the first comparative example, the terminal portion 20a of the surface wiring layer 20 to which the terminal of the electronic component 60 is fixed is formed on a region located immediately above the air-space in the acoustic wave device 40. In addition, the lid portion 52 is coupled to the terminal portion 20a through the vias 32. Thus, when a shock is applied to the electronic component 60, the stress is transmitted to the lid portion 52 through the vias 32, the air-space 46 of the acoustic wave device 40 is crushed, and thereby a connecting portion between the lid portion 52 and the side wall portion 50, or the lid portion 52 and the side wall portion 50 themselves are broken. This causes moisture to easily penetrate into the air-space 46 from the outside, and decreases resistance against humidity. In addition, if the lid portion 52 comes in contact with the functional element 44 by the crush of the air-space 46, the functional element 44 may fail to excite the acoustic wave. Further, when the insulating layers 10, 12, 14, 16 are formed of a resin, moisture and/or an unreacted substance (e.g. fluorine or chlorine) vaporizes and is emitted from the insulating layers by the heat applied for mounting the electronic component module on the motherboard of an electronic device. However, the moisture and/or the unreacted substance produced in the insulating layers, which are internal layers of the multi-layered wiring board 30, is not discharged to the outside, and retained in the multi-layered wiring board 30. Thus, deterioration with age may cause the aforementioned moisture and/or the unreacted substance to penetrate into the air space 46.

Figure 2:
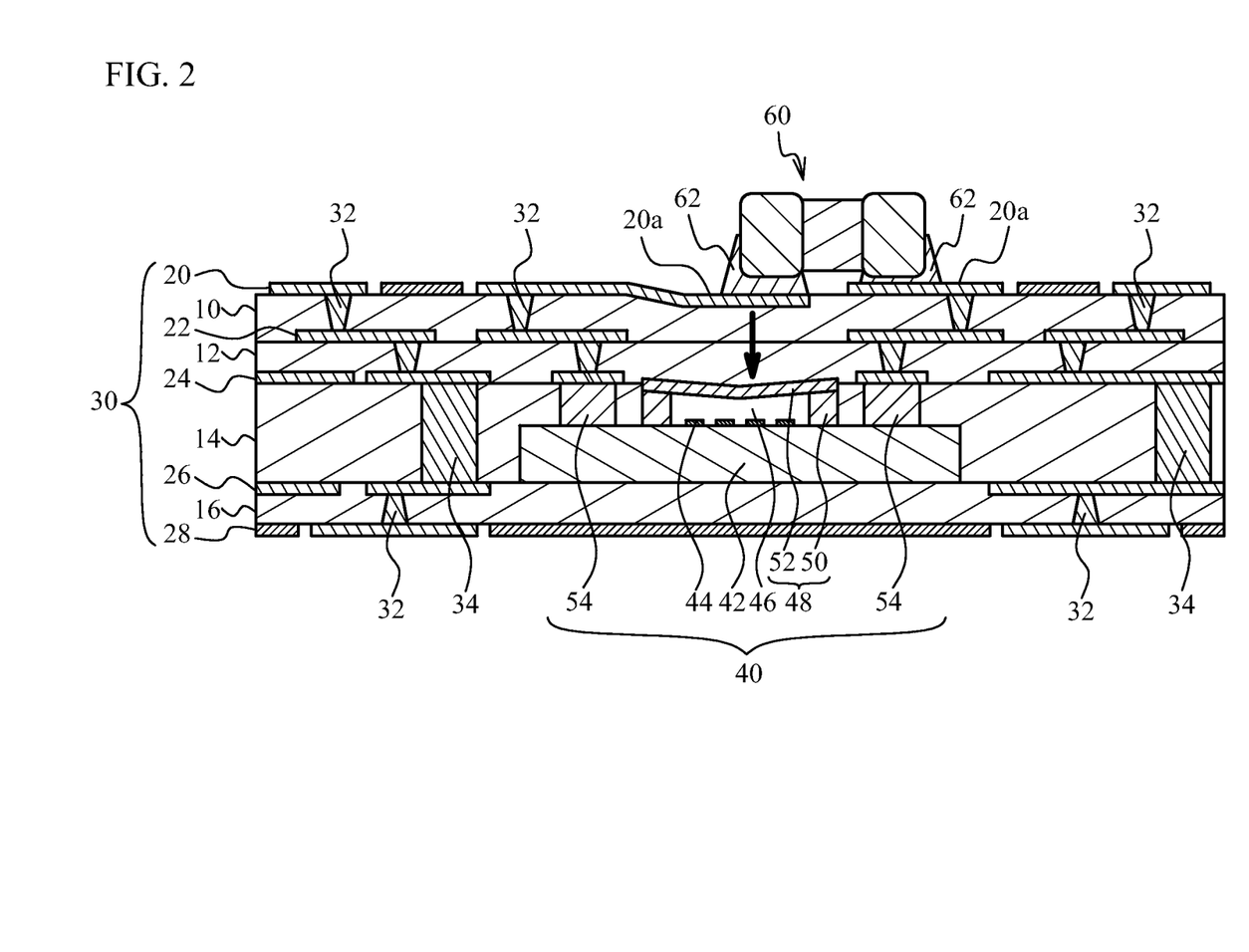
FIG. 2 is a diagram illustrating an electronic component module illustrating a second comparative example.

FIG. 2 is a schematic cross-sectional view illustrating an electronic component module in accordance with a second comparative example. The same reference numerals are affixed to the same components as those of the first comparative example (FIG. 1), and the detailed description thereof is omitted. Unlike FIG. 1, a via is not formed in a region above the lid portion 52 and a region below the terminal portion 20a. However, the terminal portion 20a is formed at a position overlapping the air-space 46 of the acoustic wave device 40 as viewed from the stacking direction of the multi-layered wiring board 30. Thus, when a shock is applied to the electronic component 60, the stress is transmitted to the lid portion 52 through the insulating layers 10 and 12, the air-space 46 of the acoustic wave device 40 is crushed, and thereby the connecting portion between the lid portion 52 and the side wall portion 50 or the lid portion 52 and the side wall portion 50 themselves are broken. This causes moisture or an unreacted substance to easily penetrate into the air-space 46 from the outside, and decreases resistance against humidity. If the lid portion 52 comes in contact with the functional element 44 by the crush of the air-space 46, the functional element 44 may fail to excite the acoustic wave.

As described above, the electronic component modules of the comparative examples have a problem that the acoustic wave device 40 embedded in the multi-layered wiring board 30 is mechanically broken by a shock applied to the electronic component 60 mounted on the surface. Moreover, reliability of the acoustic wave device 40 may be decreased by moisture penetration or unintended electrical connection due to the aforementioned mechanical breaking. Embodiments hereinafter describe a structure of an electronic component module and a method of fabricating it that are capable of preventing the mechanical breaking and reliability degradation of the acoustic wave device 40 embedded in the multi-layered wiring board 30.

First Embodiment

Figure 3:
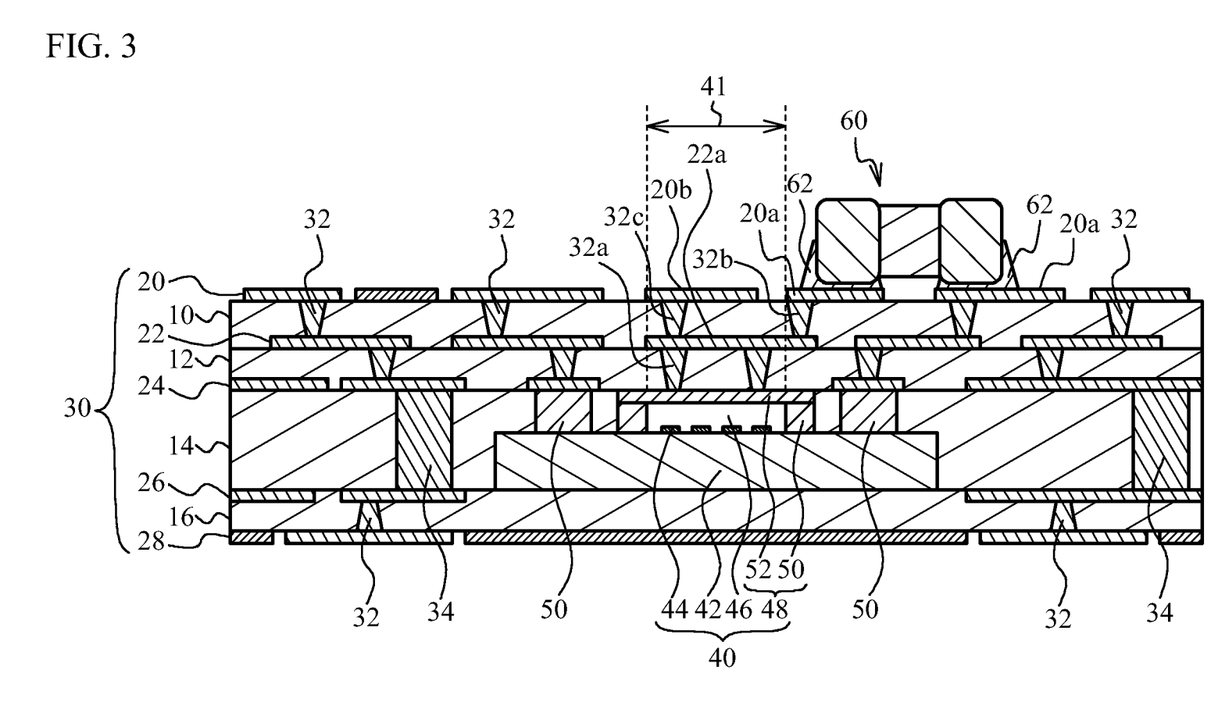
FIG. 3 is a diagram illustrating a structure of an electronic component module in accordance with a first embodiment.

FIG. 3 is a schematic cross-sectional view illustrating an electronic component module in accordance with a first embodiment. The same reference numerals are affixed to the same components as those of the first comparative example (FIG. 1), and the detailed description thereof is omitted. In the first embodiment, the terminal portion 20a of the surface wiring layer 20 is formed outside a region (41) above the air-space 46 in the acoustic wave device 40. In other words, the terminal portion 20a of the surface wiring layer 20 is formed at a position not overlapping the air-space 46 of the acoustic wave device 40 as viewed from the stacking direction of the multi-layered wiring board 30.

In the first embodiment, the lid portion 52 is formed of a metal layer (e.g. Cu). A first via 32a piercing through the insulating layer 12 is formed on the lid portion 52, and the lid portion 52 is electrically connected to a floating metal layer 20b of the surface wiring layer 20 through the first via 32a and a via 32c piercing through the insulating layer 10. The floating metal layer 20b is a wiring pattern that electrically floats (not connected to a power source or a ground), and acts as a heat release pattern that releases heat from the lid portion 52 through the vias (32a, 32c).

A second via 32b piercing through the insulating layer 10 is formed in the terminal portion 20a. The second via 32b is coupled to a wiring pattern 22a that is a part of the inner wiring layer 22. The first via 32a coupled to the lid portion 52 is also coupled to the wiring pattern 22a. Thus, the acoustic wave device 40 and the electronic component 60 are configured to be electrically interconnected through the first via 32a and the second via 32b.

Figure 4A:
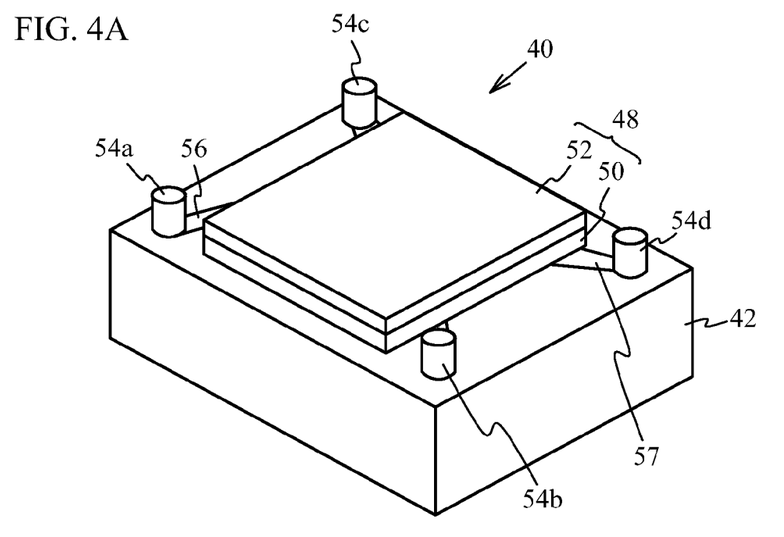
FIG. 4A and FIG. 4B are diagrams illustrating a detailed structure of an acoustic wave device (No. 1)
Figure 4B:
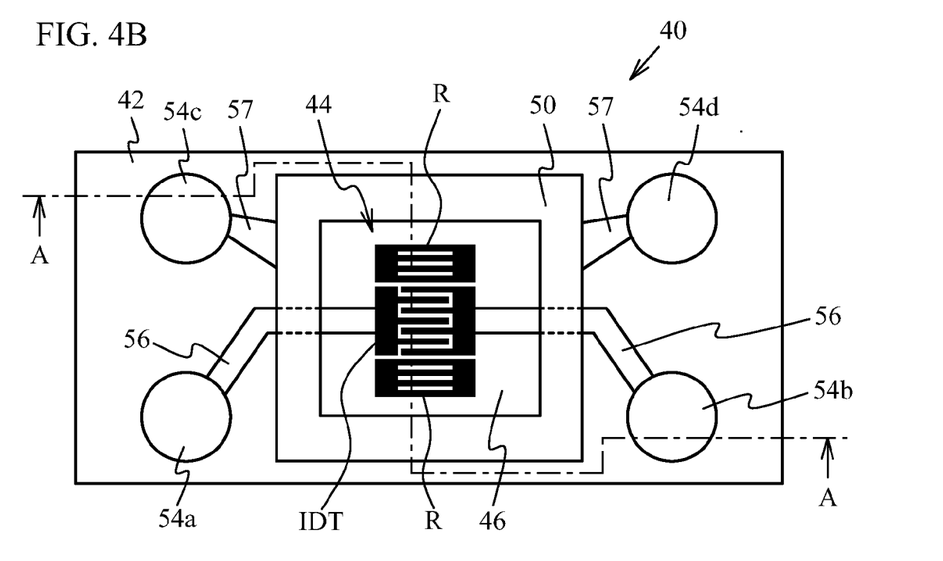

FIG. 4A and FIG. 4B are diagrams illustrating a detailed structure of the acoustic wave device 40. FIG. 4A is an external perspective view of the acoustic wave device 40, and FIG. 4B is a schematic plan view illustrating the lid portion 52 transparently. The substrate 42 of the acoustic wave device 40 may be a piezoelectric substrate made of a piezoelectric material such as lithium tantalate ($LiTaO_3$) or lithium niobate ($LiNbO_3$). On the substrate 42, formed is the functional element 44 including a comb-shaped electrode (IDT) and reflectors R located at the both sides of the IDT. The substrate 42 may have a thickness of, for example, 250 µm. The IDT and the reflectors R may be made of a metal such as aluminum (Al). Although FIG. 4B only illustrates a pair of IDTs and the reflectors R, a desired circuit such as a filter circuit is formed by combining acoustic wave device elements including the IDT and the reflectors R in the actual acoustic wave device 40.

The side wall portion 50 of which the planar shape is approximately rectangle is formed in the substrate 42 so as to surround the IDT and the reflectors R. The side wall portion 50 may be formed of a metal including, for example, Cu or nickel (Ni), and may have a thickness of, for example, 30 µm. The plate-like lid portion 52 covering the IDT and the reflectors R is formed on the side wall portion 50 so that the air-space 46 is formed above the IDT and the reflectors R. The lid portion 52 may be formed of a metal plate including, for example, Cu or Ni, and may have a thickness of, for example, 20 µm. As described above, the IDT and the reflectors R are sealed by the sealing portion 48 including the side wall portion 50 and the lid portion 52 so as to have the air-space 46 thereabove.

Four protrusion electrodes 54 are arranged on the substrate 42 outside the sealing portion 48. One of the protrusion electrodes is for signal input (54a), one is for signal output (54b), and remaining two are for ground (54c, 54d). The signal input protrusion electrode 54 and the signal output protrusion electrode 54 are electrically connected to the IDT through wirings 56. An insulating layer (not illustrated) is located between the wiring 56 and the side wall portion 50, and they are electrically insulated from each other. On the other hand, the ground protrusion electrodes 54c and 54d are electrically connected to the side wall portion 50 through wirings 57. Thus, the side wall portion 50 and the lid portion 52 shield the IDT and the reflectors R in the acoustic wave device 40 from the external electromagnetical field.

Figure 5:
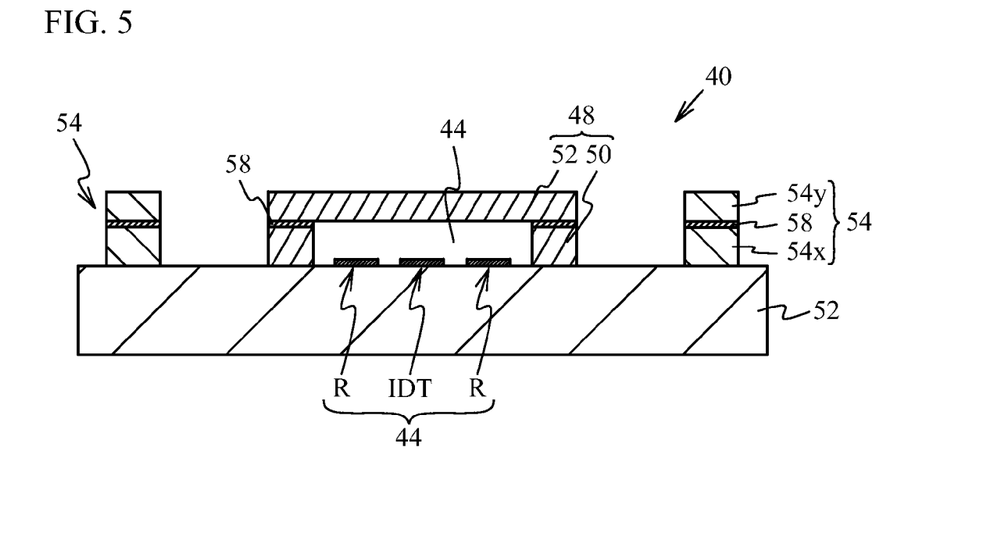
FIG. 5 is a diagram illustrating the detailed structure of the acoustic wave device (No. 2)

FIG. 5 is a cross-sectional view taken along line A-A in FIG. 4B. Each of the protrusion electrodes 54 includes a columnar lower portion 54x, a columnar upper portion 54y, and a connecting member 58 located between the upper and lower portions. The connecting member 58 may be made of, for example, gold (Au)-tin (Sn) solder. Moreover, the side wall portion 50 and the lid portion 52 constituting the sealing portion 48 are interconnected by the connecting member 58.

A description will next be given of a method of fabricating the electronic component module of the first embodiment.

Figure 6A:
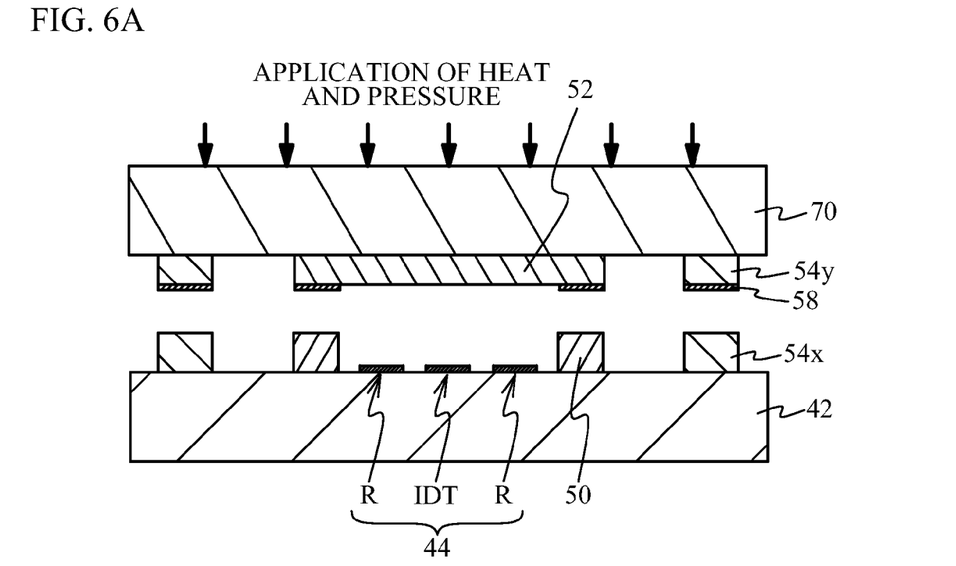
FIG. 6A and FIG. 6B are diagrams illustrating a method of fabricating the electronic component module in accordance with the first embodiment (No. 1)

FIG. 6A through FIG. 10B are schematic cross-sectional views illustrating the method of fabricating the electronic component module of the first embodiment. The detailed structure of the electronic component module is already described in FIG. 3, and thus some reference numerals are omitted in the drawings to explain the fabrication process as needed. As illustrated in FIG. 6A, the IDT, the reflectors R, the side wall portion 50, and the lower portions 54x of the protrusion electrodes 54 are first formed on the substrate 42. The IDT and the reflectors R may be formed by, for example, vapor deposition of a metal mainly including aluminum and liftoff. The side wall portion 50 and the lower portions 54x of the protrusion electrodes 54 may be formed by selectively depositing a metal mainly including copper by electrolytic plating.

In parallel with the forming of the aforementioned metal layer, the lid portion 52 and the upper portions 54y of the protrusion electrodes 54 are selectively formed on a support substrate 70 made of stainless steel such as SUS304 (illustrated downward in FIG. 6). Then, the connecting members 58 made of, for example, gold (Au)-tin (Sn) solder is formed on the edge portion of the upper surface of the lid portion 52 and the surfaces of the upper portions 54y of the protrusion electrodes 54. The lid portion 52, the upper portions 54y of the protrusion electrodes 54, and the connecting members 58 may be formed by, for example, electrolytic plating.

Figure 6B:
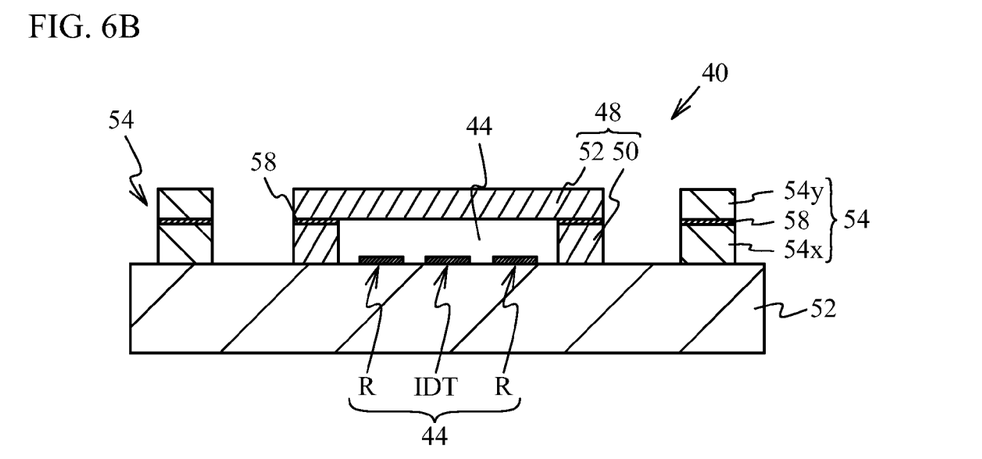

Next, the support substrate 70 is located above the substrate 42 so that the lid portion 52 faces the side wall portion 50 and the upper portions 54y of the protrusion electrodes 54 faces the lower portions 54x. Then, the connecting members 58 are heated to a temperature greater than or equal to the melting point of the connecting member 58 (e.g. 250 to 300° C.), and the support substrate 70 is pressed toward the substrate 42. This process bonds the lid portion 52 to the side wall portion 50 through the connecting members 58, and thereby the sealing portion 48 having the air-space 46 above the IDT and the reflectors R is formed as illustrated in FIG. 6B. In addition, the lower portions 54x and the upper portions 54y of the protrusion electrodes 54 are bonded to each other by the connecting members 58 to form the protrusion electrodes 54. The support substrate 70 is then removed to form the sealing portion 48 having the air-space 46 above the IDT and the reflectors R, and formed is the acoustic wave device 40 including the protrusion electrodes 54 located around the sealing portion 48.

The lid portion 52 preferably includes Cu to achieve high heat release performance and low electric resistance, and a Ni layer is preferably formed on the Cu layer to reduce the non-uniformity of the thickness. In addition, the support substrate 70 is preferably made of a material such as SUS304 that functions as a base for plating Cu and has adhesiveness to the extent that it can be easily removed from the lid portion 52 after sealing. Further, a piezoelectric material same as that of the piezoelectric substrate 42 may be used for the support substrate 70 to reduce positional misalignment due to a difference in thermal expansion coefficient. When a piezoelectric substance is used for the support substrate 70, it is preferable that a first metal layer for electrolytic plating (e.g. Al layer or Cu layer with low electric resistance) is formed on the surface of the support substrate 70, and a second metal layer with an appropriate adhesiveness (e.g. Ti layer from which a plated material is easily removed) is further formed on the first metal layer.

The acoustic wave device 40 is fabricated as described above. A description will next be given of a method of fabricating the electronic component module including the acoustic wave device 40 embedded therein.

Figure 7:
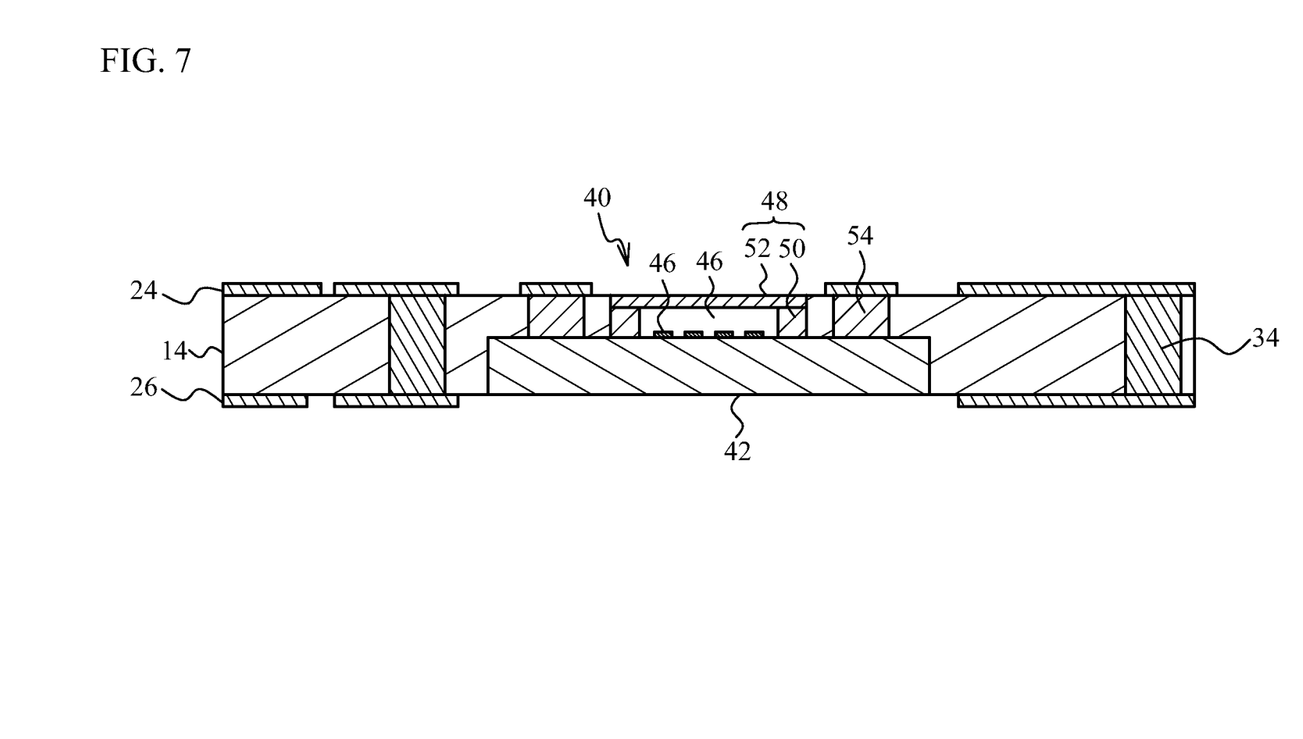
FIG. 7 is a diagram illustrating the method of fabricating the electronic component module in accordance with the first embodiment (No. 2)

As illustrated in FIG. 7, the acoustic wave device 40 formed through the aforementioned process is first embedded in the insulating layer 14. Vias 34 and the inner wiring layers 24 and 26 are formed in the insulating layer 14, where the via 34 pierces through the insulating layer 14, and the inner wiring layers 24 and 26 are selectively formed on both the upper and lower surfaces of the insulating layer 14. The upper surface of the acoustic wave device 40 is preferably exposed to the upper surface of the insulating layer 14, and at least the upper surface of the lid portion 52 preferably forms the same plane as the upper surface of the insulating layer 14.

Figure 8:
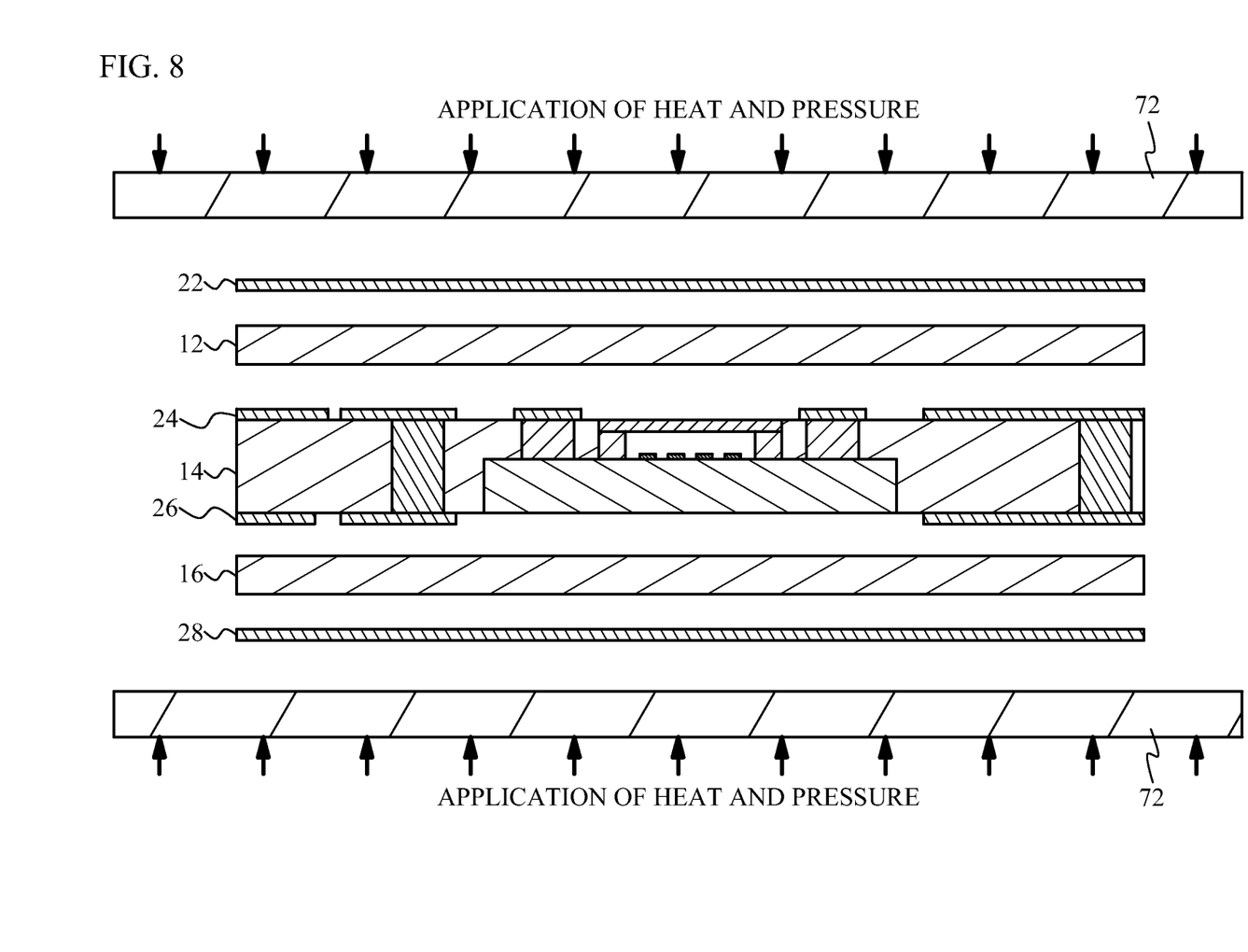
FIG. 8 is a diagram illustrating the method of fabricating the electronic component module in accordance with the first embodiment (No. 3)
Figure 9A:
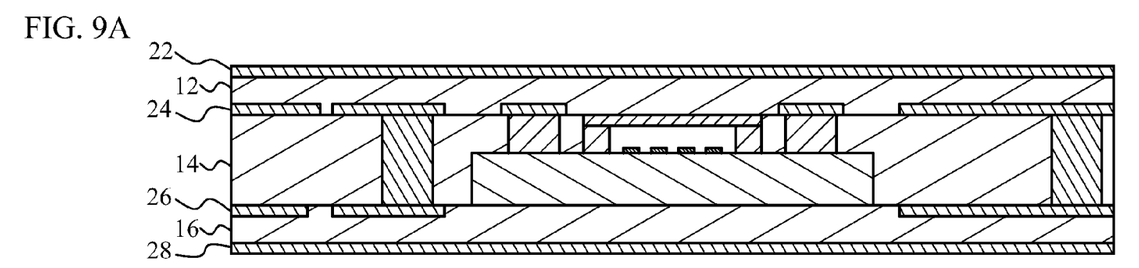
FIG. 9A through FIG. 9C are diagrams illustrating the method of fabricating the electronic component module in accordance with the first embodiment (No. 4)

As illustrated in FIG. 8, the prepreg insulating layer 12 and the wiring layer 22 are then sequentially located at the upper surface side of the insulating layer 14 while the prepreg insulating layer 16 and the wiring layer 28 are sequentially located at the lower surface side of the insulating layer 14. Then, the insulating layers 12 and 16 and the wiring layers 22 and the 28 are heated, and the insulating layers 12 and 16 and the wiring layers 22 and 28 are pressed toward the insulating layer 14 with a support 72. This process bonds the insulating layers 12 and 16 and the wiring layers 22 and 28 to the insulating layer 14, and the multi-layered wiring board including the acoustic wave device 40 embedded therein is thereby obtained as illustrated in FIG. 9A.

Figure 9B:
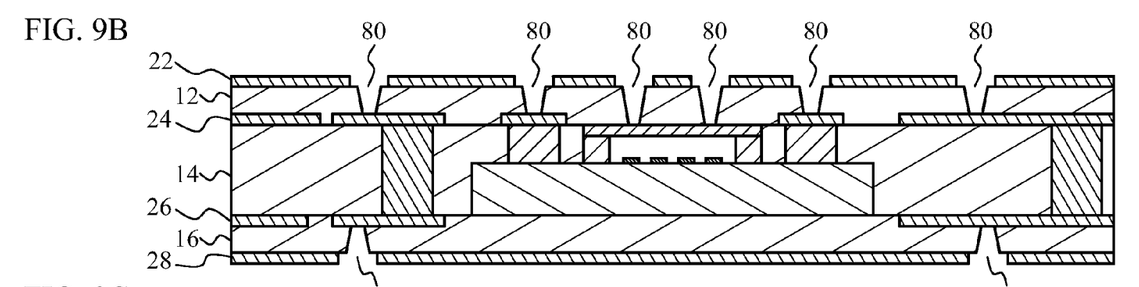

As illustrated in FIG. 9B, apertures are then formed in the wiring layers 22 and 28 by etching the upper surface of the wiring layer 22 and the lower surface of the wiring layer 28 using resist layers (not illustrated) as a mask. This makes the insulating layers 12 and 16 exposed. Penetration holes 80 piercing through the insulating layers 12 and 16 are then formed by, for example, irradiating the exposed insulating layers 12 and 16 with a laser beam. This makes the wiring layers 24 and 26 exposed.

Figure 9C:
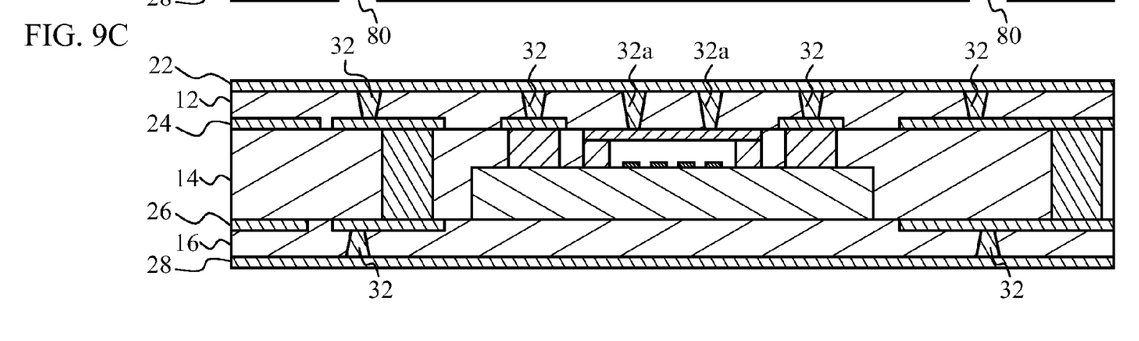

Next, the vias 32 are formed in the penetration holes 80 as illustrated in FIG. 9C. The vias 32 may be formed by electroless plating that forms a seed metal and electrolytic plating that uses the seed metal as an electrical supply line. In addition, plated layers are also formed on the upper surface of the insulating layer 12 and the lower surface of the insulating layer 16. Thus, the wiring layers 22 and 28 are formed again on the whole of the upper surface of the insulating layer 12 and the whole of the lower surface of the insulating layer 16.

Figure 10A:
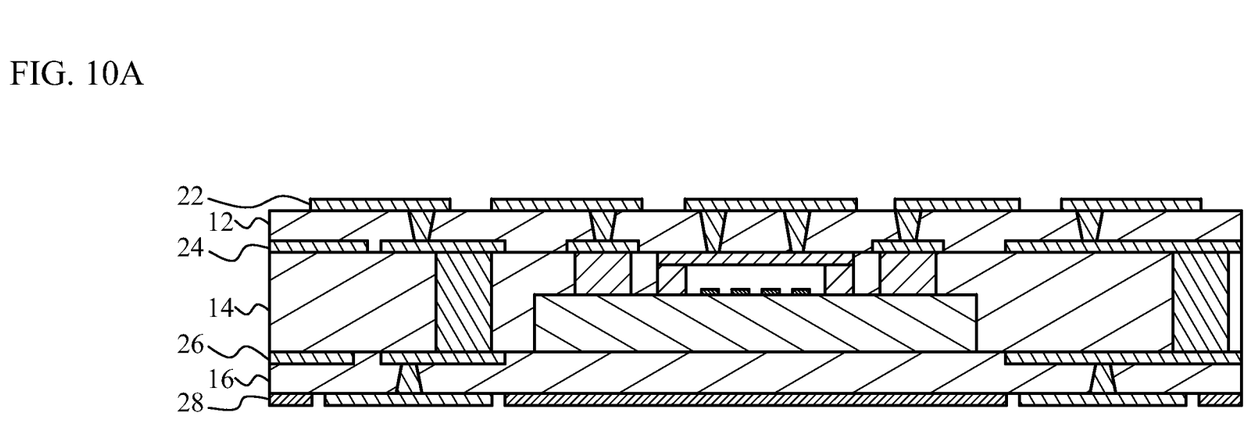
FIG. 10A and FIG. 10B are diagrams illustrating the method of fabricating the electronic component module in accordance with the first embodiment (No. 5)
Figure 10B:
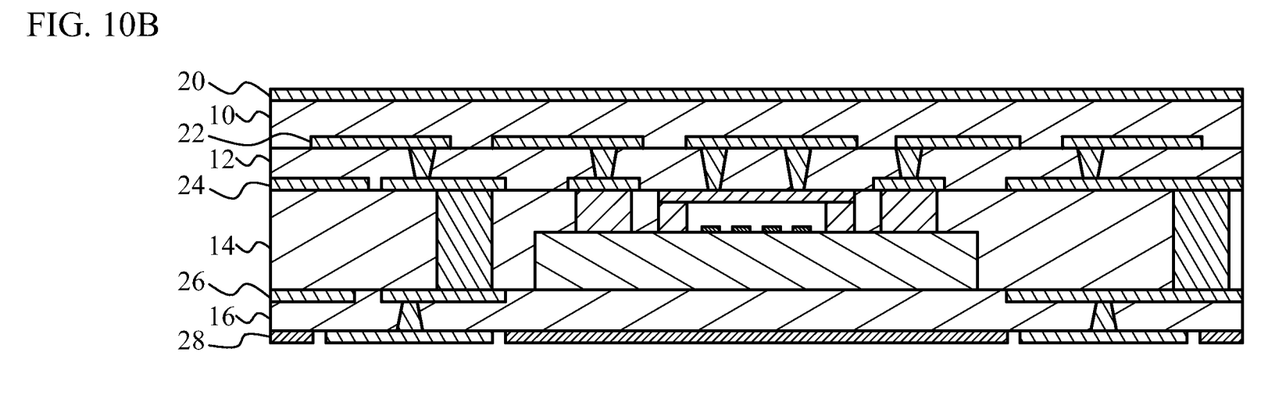
Figure 11A:
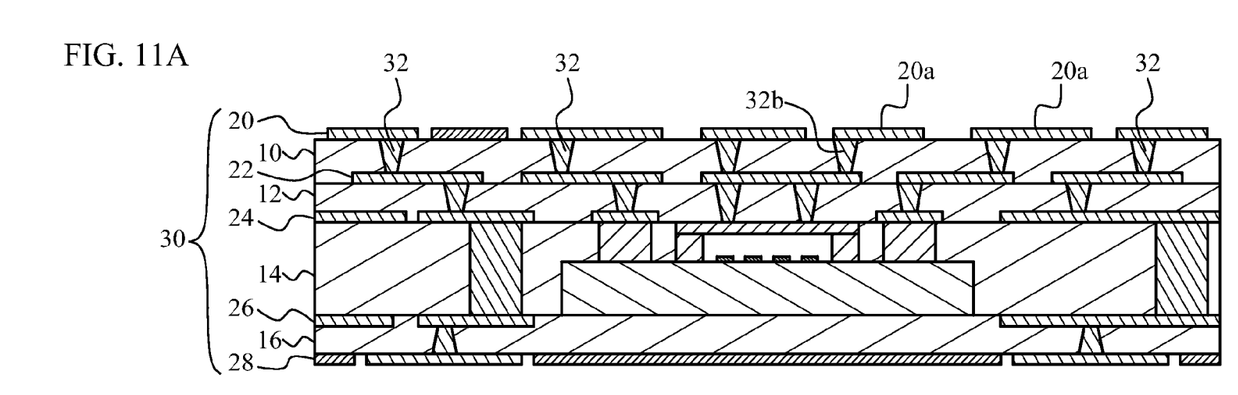
FIG. 11A and FIG. 11B are diagrams illustrating the method of fabricating the electronic component module in accordance with the first embodiment (No. 6)
Figure 11B:
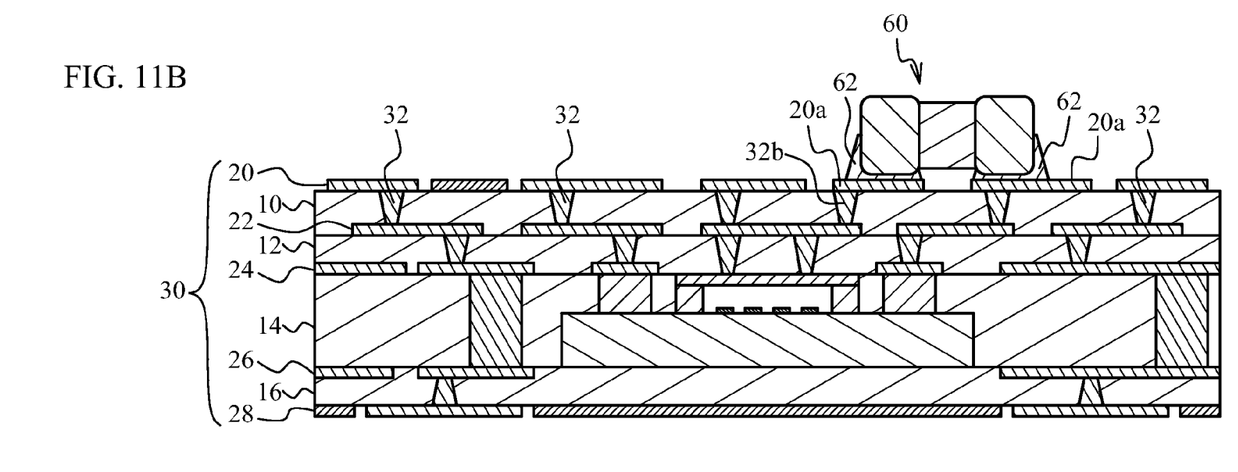

As illustrated in FIG. 10A, the wiring layers 22, 28 are patterned into a desired shape by etching the upper surface of the wiring layer 22 and the lower surface of the wiring layer 28 using resist layers (not illustrated) as masks. As illustrated in FIG. 10B and FIG. 11A, the same process as the process described in FIG. 8 through FIG. 10A is repeated to form the multi-layered wiring board 30 including the acoustic wave device 40 embedded therein. Then, as illustrated in FIG. 11B, the solder 62 is located on the surface wiring layer 20 on the upper surface of the multi-layered wiring board 30, and the electronic component 60 is mounted by reflow. The above process forms the electronic component module of the first embodiment.

In the electronic component module of the first embodiment, when a shock is applied to the electronic component 60, the main portion of the stress due to the shock is transmitted in the stacking direction of the multi-layered wiring board 30. Thus, even when a shock is applied to the electronic component 60, the stress can be prevented from being transmitted to the lid portion 52 that maintains the air-space 46 by not forming the terminal portion 20a to which the terminal of the electronic component 60 is fixed in a region above the air-space 46 of the acoustic wave device 40 as illustrated in FIG. 3. Therefore, the lid portion 52 is kept parallel to the functional element 44 of the acoustic wave device 40, and the air-space 46 is not crushed. Therefore, the acoustic wave device 40 can be prevented from being mechanically broken. Moreover, resistance against humidity can be improved because moisture or an unreacted substance is prevented from penetrating into the air-space 46 from the outside by maintaining the air-space 46 against the crush. Further, the maintaining of the air-space 46 can prevent the occurrence of unintended electrical connection.

In addition, the first embodiment forms the lid portion 52 with a metal layer and forms the first via 32a, which is electrically connected to the lid portion 52, on the lid portion 52. This allows the acoustic wave device 40 to electrically connect to the outside through the lid portion 52, and therefore improves the design flexibility. It is sufficient if the first via 32a coupled to the lid portion 52 pierces through at least one insulating layer of the insulating layers of the multi-layered wiring board 30.

In addition, the first embodiment connects the lid portion 52 to a ground, and connects the ground terminal of the electronic component 60 to the lid portion 52 through the second via 32b and the first via 32a. This enhances the connection of the electronic component 60 to a ground, and reduces the number of ground terminals.

In addition, the first embodiment forms the first via 32a coupled to the lid portion 52 and the second via 32b coupled to the terminal portion 20a as separate vias in the positions not overlapping each other as viewed from the stacking direction of the multi-layered wiring board 30. This enables to prevent a shock applied to the electronic component 60 from being transmitted to the lid portion 52 of the acoustic wave device 40 through the vias even when the acoustic wave device 40 is electrically coupled to the electronic component 60. Thus, the acoustic wave device 40 can be prevented from being mechanically broken. In addition, prevented is reliability degradation of the acoustic wave device 40 due to moisture penetration or unintended electrical connection by the aforementioned mechanical breaking. In the present embodiment, the first via 32a and the second via 32b are formed on different insulating layers (10, 12), but the first via 32a and the second via 32b may be formed in the same insulating layer.

In addition, the first embodiment connects the lid portion 52 to the floating metal layer 20b of the surface wiring layer 20 through the first via 32a. This structure enables to efficiently release the heat generated in the acoustic wave device 40 through the floating metal layer 20b that acts as a heat release pattern. In addition, the floating metal layer 20b is a wiring pattern that electrically floats and on which the electronic component 60 is not mounted, and thus less transmits a shock to the lid portion 52 through the first via 32a than a wiring pattern (terminal portion 20a) on which the electronic component 60 is mounted. Therefore, the acoustic wave device 40 can be prevented from being mechanically broken. In addition, prevented is reliability degradation of the acoustic wave device 40 due to moisture penetration or unintended electrical connection by the aforementioned breaking.

The first embodiment describes a case where both the side wall portion 50 and the lid portion 52 are formed of a metal, but does not intend to suggest any limitation. The side wall portion 50 and the lid portion 52 may be formed of a resin such as polyimide or an epoxy resin, or an insulating material such as a ceramic material. When the side wall portion 50 and the lid portion 52 are formed of a resin, the connecting member 58 is not necessary to bond them. The lid portion 52 may be formed of a composite film of a metal and a resin. Even when the whole of the lid portion 52 is not formed of a metal layer, the electrical connection to the outside through the lid portion 52 can be achieved by forming at least a part of the uppermost layer of the lid portion 52 with a metal layer and coupling the first via 32a to the part made of the metal layer.

The side wall portion 50 and the lid portion 52 may be formed of different materials. For example, the side wall portion 50 may be formed of a metal while the lid portion 52 may be formed of a ceramic material. When the lid portion 52 is not formed of a metal, the acoustic wave device 40 is electrically coupled to the electronic component 60 not through the lid portion 52 but through the protrusion electrode 54. Moreover, the sealing portion 48 may include a member other than the side wall portion 50 and the lid portion 52. Further, the sealing portion 48 may be formed of a cap-shaped member integrally formed.

In addition, the first embodiment uses the insulating layer 14 to embed the acoustic wave device 40, but may use a metal layer (metal frame) in which a hole for housing the acoustic wave device is formed and embed the acoustic wave device 40 sealed by a resin in the center portion of the metal frame. The metal layer may be made of, for example, copper (Cu).

Second Embodiment

A second embodiment modifies the arrangement of the electronic component.

Figure 12:
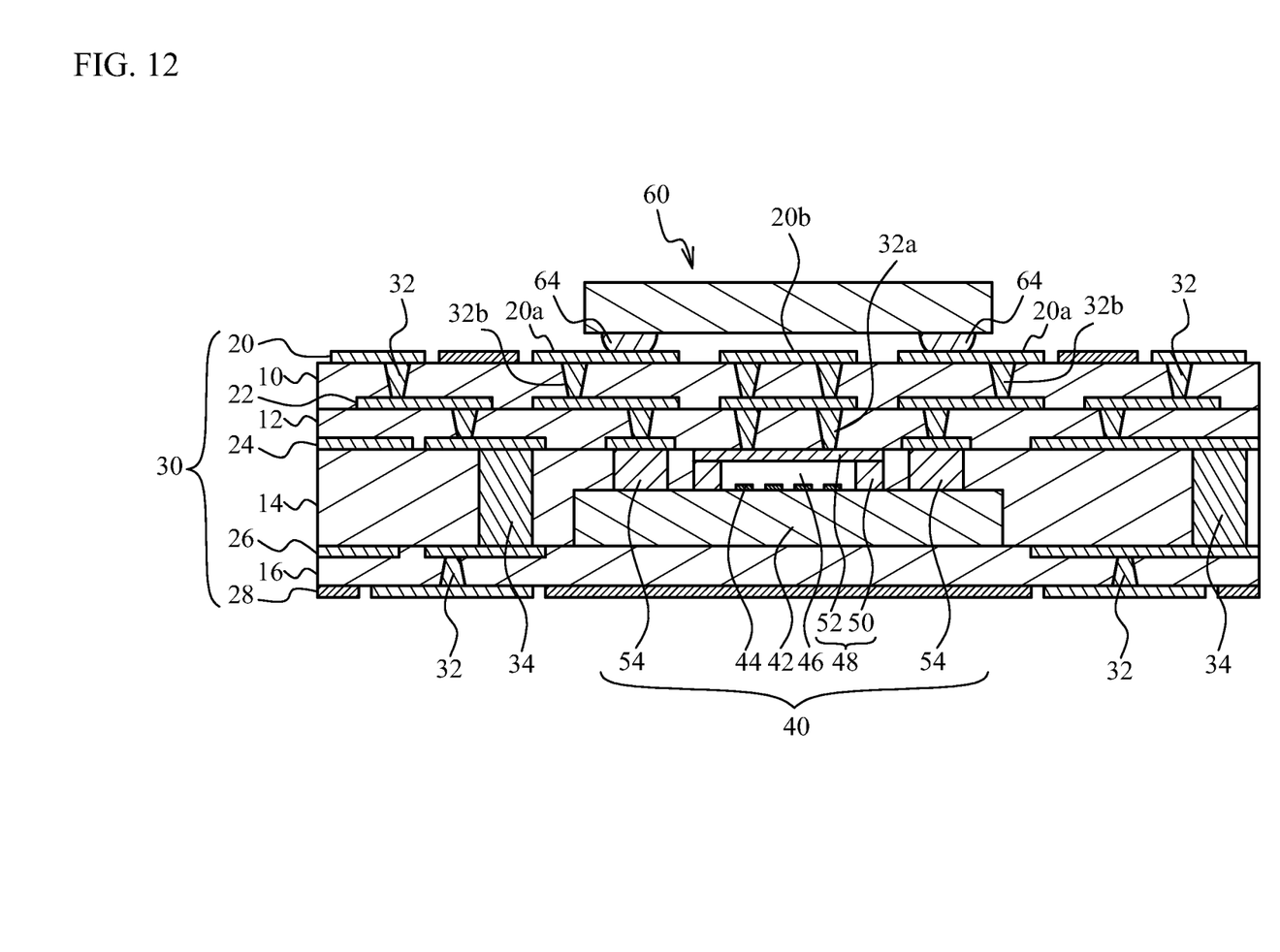
FIG. 12 is a diagram illustrating a structure of an electronic component module in accordance with a second embodiment.

FIG. 12 is a schematic cross-sectional view illustrating an electronic component module in accordance with the second embodiment. The same reference numerals are affixed to the same components as those of the first embodiment (FIG. 3), and the detailed description thereof is omitted. In the second embodiment, the electronic component 60 is arranged so as to straddle the region above the air-space in the acoustic wave device 40. In other words, the terminal portions 20a of the surface wiring layer 20 are formed in positions that make the electronic component 60 mounted so as to straddle the region above the air-space 46 when the terminals of the electronic component 60 are fixed to the terminal portions 20a. The electronic component 60 and the terminal portions 20a are interconnected by solder balls 64.

In the electronic component module of the second embodiment, the terminal portion 20a of the surface wiring layer 20 is formed in positions not overlapping the air-space 46 of the acoustic wave device 40 as viewed from the stacking direction of the multi-layered wiring board 30. Thus, as with the first embodiment, the acoustic wave device 40 can be prevented from being mechanically broken by a shock applied to the electronic component 60. In addition, prevented is reliability degradation of the acoustic wave device 40 due to moisture penetration or unintended electrical connection by the aforementioned mechanical breaking.

In addition, the electronic component 60 can be mounted on a region above the air-space 46 by arranging the electronic component 60 so as to straddle the region above the air-space 46 of the acoustic wave device 40, and the electronic component module can be therefore downsized. Further, as illustrated in FIG. 12, the second embodiment also forms the floating metal layer 20b, and connects it to the lid portion 52 through the first vias 32a. This enables to efficiently release the heat generated in the acoustic wave device 40 through the floating metal layer 20b that acts as a heat release pattern.

The first and second embodiments describe a case where the acoustic wave device 40 embedded in the multi-layered wiring board 30 is a surface acoustic wave device, but may be applied to a case where a Love wave device or a boundary acoustic wave device is used as the acoustic wave device 40. In addition, a bulk acoustic wave device (e.g. a piezoelectric thin film resonator or a Lamb wave device) using a bulk acoustic wave may be used as the acoustic wave device in addition to a device using a surface acoustic wave. Regardless of the type of the acoustic wave device, when an air space is provided above a functional element for exciting an acoustic wave, the acoustic wave device 40 can be prevented from being mechanically broken by a shock applied to the electronic component 60 by configuring the position of the terminal portion 20a as described in the first and second embodiments. Moreover, prevented is reliability degradation of the acoustic wave device 40 due to moisture penetration or unintended electrical connection by the aforementioned mechanical breaking.

Although the embodiments of the present invention have been described in detail, it is to be understood that the various change, substitutions, and alterations could be made hereto without departing from the spirit and scope of the invention.

What is claimed is:

1. An electronic component module comprising:
   a multi-layered wiring board formed by stacking insulating layers, an inner wiring layer formed between the insulating layers, and a surface wiring layer formed on an outermost insulating layer of the insulating layers; and
   an acoustic wave device located inside the multi-layered wiring board,
   wherein the acoustic wave device includes a substrate, a functional element and a sealing portion, the functional element being located on the substrate and exciting an acoustic wave, the sealing portion being located on an upper surface of the substrate and sealing the functional element so as to form an air-space above the functional element,
   wherein a terminal portion of the surface wiring layer does not overlap with the air-space of the acoustic wave device as viewed from a stacking direction of the multi-layered wiring board, the terminal portion being a region to which a terminal of an electronic component is fixed in the surface wiring layer,
   wherein each of the insulating layers extends to outside of the substrate, and at least one of the insulating layer is located between an upper surface of the acoustic wave device and the surface wiring layer.

2. The electronic component module according to claim 1, wherein
   the sealing portion includes a side wall portion surrounding the functional element and a lid portion formed on the side wall portion, and
   the electronic component module further comprises a first via that is formed on the lid portion so as to be electrically connected to the lid portion, said first via piercing through said at least one of the insulating layers and overlapping with the air-space as viewed from said stacking direction.

3. The electronic component module according to claim 2, wherein
   the surface wiring layer includes a floating metal layer that overlaps with the air-space as viewed from said stacking direction and that electrically floats, and the floating metal layer is electrically connected to the lid portion through the first via.

4. The electronic component module according to claim 2, wherein the lid portion includes a lid portion metal layer that is a metal layer formed in at least a part of the lid portion and electrically connected to the first via.

5. The electronic component module according to claim 1, wherein the terminal portion is formed in a position that makes the electronic component mounted so as to straddle a region overlapping with the air-space when a terminal of the electronic component is fixed to the terminal portion.

6. The electronic component module according to claim 1, wherein the acoustic wave device includes a surface acoustic wave device.

7. The electronic component module according to claim 1, wherein the acoustic wave device includes a piezoelectric thin film resonator.

8. The electronic component module according to claim 1, further comprising:
   the electronic component of which a terminal is fixed to the terminal portion.

9. An electronic component module comprising:
   a multi-layered wiring board formed by stacking insulating layers, an inner wiring layer formed between the insulating layers, and a surface wiring layer formed on an outermost insulating layer of the insulating layers; and
   an acoustic wave device located inside the multi-layered wiring board,
   wherein the acoustic wave device includes a functional element and a sealing portion, the functional element being located on a substrate and exciting an acoustic wave, and the sealing portion sealing the functional element so as to form an air-space above the functional element, wherein a terminal portion of the surface wiring layer does not overlap the air-space of the acoustic wave device as viewed from a stacking direction of the multi-layered wiring board, the terminal portion being a region to which a terminal of an electronic component is fixed in the surface wiring layer, wherein the sealing portion includes a side wall portion surrounding the functional element and a lid portion formed on the side wall portion, wherein the electronic component module further comprises a first via that is formed on the lid portion so as to be electrically connected to the lid portion and pierces through at least one of the insulating layers and a second via that is formed below the terminal portion so as to be electrically connected to the terminal portion and pierces through at least one of the insulating layers, and wherein the first via and the second via do not overlap with each other as viewed from the stacking direction of the multi-layered wiring board.

* * * * *